(12) United States Patent
Stickel

(10) Patent No.: US 6,617,585 B1
(45) Date of Patent: Sep. 9, 2003

(54) OPTIMIZED CURVILINEAR VARIABLE AXIS LENS DOUBLET FOR CHARGED PARTICLE BEAM PROJECTION SYSTEM

(75) Inventor: Werner Stickel, Ridgefield, CT (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/577,475

(22) Filed: May 24, 2000

(51) Int. Cl.[7] ............................................. H01J 37/09
(52) U.S. Cl. ........................... 250/396 R; 250/396 ML
(58) Field of Search ................. 250/396 R, 396 ML, 250/398

(56) References Cited

U.S. PATENT DOCUMENTS

| | | | |
|---|---|---|---|
| 5,466,904 A | 11/1995 | Pfeiffer et al. | 219/121.25 |
| 5,545,902 A | 8/1996 | Pfeiffer et al. | 250/492.2 |
| 5,936,252 A | 8/1999 | Stickel et al. | 250/492.23 |
| 5,989,753 A | 11/1999 | Okino | 430/5 |
| 6,005,250 A * | 12/1999 | Stickel et al. | 250/396 R |
| 6,023,067 A * | 2/2000 | Stickel et al. | 250/396 R |
| 6,027,843 A | 2/2000 | Kojima et al. | 430/30 |
| 6,420,713 B1 * | 7/2002 | Stickel et al. | 250/396 R |

* cited by examiner

*Primary Examiner*—Kiet T. Nguyen
(74) *Attorney, Agent, or Firm*—Graham S. Jones, II

(57) ABSTRACT

This is a method for designing an optimized charged particle beam projection system. Specify lens configuration and first order optics. Calculate lens excitations. Configure the lens system, providing lens field distributions, beam landing angle, and imaging ray/axis cross-over. Provide an input deflector configuration. Solve a linear equation set, and thereby provide a curvilinear axis and associated deflection field distributions. Calculate the third order aberration coefficients yielding a list of up to 54 aberration coefficients. Provide an input of dynamic correctors. Calculate excitations to eliminate quadratic aberrations in deflection. Calculate third and fifth order aberrations, providing image blur and distortion vs. deflection, best focal plane, and depth of focus. Determine whether the current result is better than the previous result. If YES then change the axial location input to the solve linear equation set. If NO, test whether the current result is acceptable. If NO, provide a deflector configuration. If YES, test whether the deflection current is larger. If YES, change the input for the axial location of the deflectors to solve the linear equation set again. If NO then END the process.

13 Claims, 10 Drawing Sheets

OPTIMIZED CURVILINEAR VARIABLE AXIS LENS DOUBLET FOR CHARGED PARTICLE BEAM PROJECTION SYSTEM

BACKGROUND OF THE INVENTION

1. Field of the Invention

This invention relates to charged particle beam projection systems and more particularly to a method of design and manufacture of Charged Particle Beam Projection Systems (CPBPS).

2. Description of Related Art

For the purpose of lithography (among other things) in semiconductor electronics fabrication, a Charged Particle Beam Projection System as described in U.S. Pat. No. 5,466,904 of Pfeiffer et al. for "Electron Beam Lithography System" and U.S. Pat. No. 5,545,902 of Pfeiffer et al. for "Electron Beam Lithography System" employs Large Area Reduction Projection Optics with beam Scanning (LARPOS). LARPOS optical systems are based on providing a doublet of lenses for imaging a large object (integrated circuit pattern in a reticle), in combination with deflectors for positioning the image on the target (wafer) within a given range (scan field). There are numerous conceivable different combinations for providing such imaging/deflection, each characterized by the operating (input) requirements and performance in terms of image fidelity and positioning or exposure speed.

In turn, image fidelity is defined by the edge acuity, with which the pattern features are delineated in the exposure sensitive material (e.g. electron beam sensitive resist) on the wafer, as well as the trueness, with which the feature shape is reproduced. The former is often referred to in terms of the negative aspect of image "blur". The result of lack of trueness of shape is often referred to as image "distortion". Both of these performance criteria are determined by the (charged particle) optical aberrations of the system, as well as Coulomb interactions between the charged particles (see below).

Among all CPBPS systems, LARPOS systems are subject to the largest number of aberrations or deviations of the individual particle trajectories from 'ideal' or Gaussian optics. A class of aberrations is related to the lens system. Another class of aberrations is related to the deflection system. A third class of aberrations, so-called 'hybrid' terms, is related to both.

The main goal for the designer of such a LARPOS system is to minimize the overall impact of the aberrations, under the specific condition of maximizing the beam current, as beam current (among other factors) is the primary factor determining the exposure speed. The consequence is that beam current by affecting the exposure speed ultimately affects both the throughput and the practical viability of a Charged Particle Beam Projection Systems (CPBPS) for industrial applications.

However, a problem with such a LARPOS system is that as the beam current increases the image blur and/or distortion, which become more pronounced. This is due to the effects of forces of electrostatic repulsion between charged beam particles, commonly referred to as Coulomb interactions. These Coulomb interaction effects are strongly dependent on several configuration and operating parameters, in particular, on the path length of the particles, and become worse as the path length increases. Thus, a major incentive for the design of such a system is to minimize the object-to-image distance of the system, i.e to design a tool in which the object-to-image distance is as short as possible.

This predicates overlapping of lens and deflection fields almost completely, giving rise to the need to optimize what is now a Curvi-Linear Variable Axis (CVA). The problem is to determine the optimum CVA in terms of blur and distortion.

SUMMARY OF THE INVENTION

In accordance with this invention, a method is provided for manufacturing a structure with an optimal CVA design by determination of the criteria of and for selecting the optimum CVA in terms of blur and distortion from a virtually infinite number of possible methods.

Further in accordance with this invention, a method is provided for making an optimized charged particle beam projection system by the following steps. Specify lens configuration and first order optics and then calculate lens excitations. Then configure the lens system thereby providing lens field distributions,and the beam landing angle and axis cross-over of the principal off-axis imaging ray. Then provide an input of a deflector configuration including an axial location of the deflectors, then solve linear equation set, and thereby provide a curvilinear variable axis and associated deflection field distributions, then calculate the third order aberration coefficients yielding a list of a plurality of (up to 54) aberration coefficients. Then provide an input of dynamic correctors. Next, calculate excitations to eliminate quadratic aberrations in deflection, then calculate third and fifth order aberrations, providing image blur and distortion vs. deflection, best focal plane, and depth of focus and calculate the total current consumption of all deflectors. Then test to determine whether the current result is better than the previous result, if YES then change the input for the axial location of the deflectors to solve the linear equation set again, if NO, then proceed to test whether the current result is acceptable, if NO, then provide a new deflector configuration input to again solve the linear equation set and continue through the steps thereafter, if YES, check as to whether the current consumption by all of the deflectors is higher than that of the preceding configuration. If YES, then change the input again. If NO then END the process.

Preferably when providing an input of a deflector configuration including the step of providing a beam trajectory, the radial component of which decreases monotonically from a reticle to an aperture placed at the axis cross-over location and increases from the aperture to a target.

Preferably, the lens system comprises an antisymmetric doublet which is preferably telecentric.

Definitions

"Doublet"

The term "doublet" as used herein denotes a pair of lenses operated under a specific symmetry condition, established in the following way:

A source (of particles) illuminates an object in front of a lens pair. The object is located precisely in the back focal plane of the first lens. The first lens generates an image of the source between the pair, and an image of the (closer) object at infinity. This effectively collimates the rays of particles emerging from the object. Accordingly the first lens is labeled "collimator". The second lens is positioned exactly such that its back focal plane coincides with the front focal plane of the first lens. The second lens focuses the collimated, therefore parallel rays at its front focal plane, which then becomes the image plane for the object. Since the object is now projected into the image plane, the second lens is referred to as "projector". Under this condition the optical magnification of the lens pair is given by the ratio of the focal lengths of projector to collimator, $M=f_2/f_1$. Simultaneously, the object—image distance, is given by $L=2(f_1+f_2)$. If lenses of the same shape are used, then their sizes scale with their respective focal lengths. For example, if $f_1=4f_2$, the collimator must be four times as large as the projector to maintain congruency of the lenses. Consequently, the plane of coincidence of focal planes between the lenses, located at a distance along the system (Z) axis from the object of $z_1=2f_1$, and by $z_2=2f_2$ from the image, constitutes a plane of symmetry. The doublet is "symmetric" about the coincidence plane. In the special case of $f_1=f_2$ or unity magnification, the doublet is "mirror-symmetric".

If the source is placed infinitely far upstream of the doublet, its image will appear at the coincidence or symmetry plane. As a consequence, all rays originating from any one point on the source or its intermediate image at the symmetry plane will be parallelized by the projector. In that case, the doublet is characterized as a "telecentric symmetric doublet". If the lenses are of the magnetic type, their field polarities are generally chosen to be opposite to each other as to completely cancel the image rotation caused by each individual lens. One then speaks of an "antisymmetric doublet".

The reason for operating the lenses in the described way as a doublet is that several aberrations are eliminated (as one lens compensates the aberrations of the other lens in exactly the right ratio) and consequently image blur is reduced.

Additional Definitions

Following the nomenclature of H. C. Chu and E. Munro (Optik 61(2) (1982) 121, pages 124 and 129), the first order optics of a lens system is characterized by two so-called fundamental rays or trajectories. One ray, denoted $w_a$ emerges from the object on the system/symmetry/central axis Z with unity slope, and the other ray, denoted $w_b$, emerges from the object, (e.g. object R in FIG. 1,) at a point at unity lateral distance off the axis with zero slope, i.e. parallel to the axis. In the case of magnetic lenses, both have a radial and an azimuthal component, the former denoted $r_a$ and $r_b$, respectively. The radial components lie, by definition, in a meridional plane, (i.e. a plane through the central axis Z as shown in FIG. 1).

The introduction of deflection devices into such a lens system has the purpose—expressed in simple terms for illustration—primarily of laterally shifting the optic axes of the lenses, such that the previously off-axis fundamental ray $r_b$ is now coincidental with the shifted lens optic axis. In that case it will no longer follow the original path, but will go straight through one of the lenses, and through the following lenses possibly off their optic axes, which may have been shifted by a different amount and/or in a different direction. In order to keep the fundamental ray on the optic axes of all lenses, additional deflection devices are needed, essentially to reconnect the individual axes, lens optic axes which have been shifted in various ways.

If the axis shifting operation is dynamic, i.e. variable in time, the system is called Variable Axis Lens or VAL system. Since the overall optic axis, shifted and reconnected for each lens by deflectors, is in general curved, it is called Curvilinear Variable Axis (CVA) and the system a CVA Lens (CVAL) system.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The key to the design and the solution provided by the present invention is the selection of a necessary and sufficient number of deflectors, their suitable placement along the central axis of the system, and their relative excitations to generate a CVA distinguished by its shape, i.e. the actual path the beam follows from the object to the image. A "natural" reference for the general shape of a CVA is the so-called "$r_b$-CVA", defined by the optical axis staying within a meridional plane (situated along a meridian) through the system axis and following the path, which path is the path that would be followed by an off-system axis beam emerging parallel to the axis from the object, if no deflector were excited. As employed herein "meridian" is defined as a line lying in a plane through the central axis.

Figure 1:
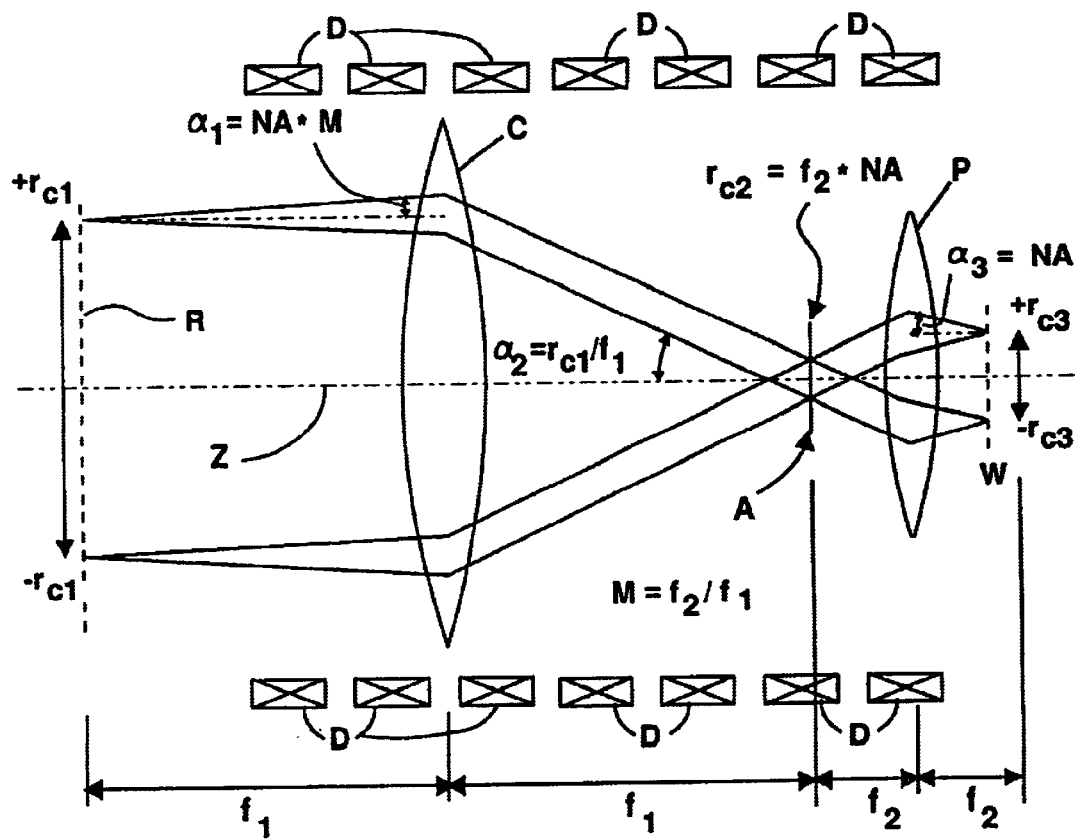
FIG. 1 is a schematic diagram showing a cross-sectional view of the configuration of an antisymmetric lens doublet defined above including a number of deflectors.

FIG. 1 is a schematic diagram showing a cross-sectional view of the configuration of an antisymmetric lens doublet defined above including a (at this point arbitrary) number of deflectors. Also indicated is the real part or radial component rb of the fundamental imaging ray (or trajectory) $w_b$, as defined by H. C. Chu and E. Munro, (Optik 61(2) (1982) pp. 121, see pages 124, 129.

In FIG. 1, on the left there is an object R, in practical cases a reticle or mask, at a distance from the first or collimator lens C of the projection doublet, which is identical to its focal length $f_1$. Rays emerging from points of object R at lateral distances $+r_{c1}$ and $-r_{c1}$ from the central axis Z, each within a cone of semi-angle $\alpha_1$, are collimated by lens C and then the rays cross each other and cross the central axis Z at an axial distance $f_1$ beyond the collimator lens C. This point, which is called the cross-over, also represents the entrance pupil of the system. The cone semi-angle $\alpha_1$ is determined by the finite size of the source (to the left of object R at infinity, not shown). Consequently, the cross-over is the conjugate image of the source with the radius $r_{c2}$, which passes through aperture A towards projector lens P. The projector lens P is placed to the right of the cross-over an axial distance $f_2$, i.e. its focal length $f_2$. The image W of the object R, which in practical cases comprises a wafer or a substrate, is further to the right of lens P by the focal distance $f_2$. The image points $+r_{c3}$ and $-r_{c3}$ are conjugate to the respective object points $-r_{c1}$ and $+r_{c1}$. The ratio $r_{c3}/r_{c1}$ is the optical magnification M of the doublet and identical to the ratio $f_2/f_1$. The final beam semi-angle $\alpha_3$ is usually referred to as the Numerical Aperture (NA) in an analogy to light-optical systems (like microscopes), and is related to the illumination semi-angle $a_1$ by the magnification M, such that $\alpha_1$=NA * M as shown in FIG. 1. Similarly, the cross-over radius is given by $r_{c2}=\alpha_1 * f_1 = f_2 *$ NA. Finally, the convergence semi-angle $\alpha_2$ is given by the ratio $r_{cl}/f_1$.

In most cases, a diaphragm with an opening referred to as aperture A is placed at the cross-over location, with an opening or aperture commensurate with $2r_{c2}$, usually as an alignment reference for the beam (which is referred to as the aperture A.)

A set of, for example, seven (7) deflectors D are formed surrounding and coaxial with the collimator lens C and projector lens P.

---

Magnification

---

M = $f_2/f_1$.
NA--------Numerical Aperture
$r_{c1}$--------radius vector of an off-axis object point
$r_{c2}$--------radius of the beam cross-over
$r_{c3}$--------radius vector of an off-axis image point
$f_1$---------focal length of collimator lens C
$f_2$---------focal length of projector lens P

---

FIGS. 2A–2D show four examples of CVAs which demonstrate that one with the closest resemblance to the $r_b$-CVA, but distinctively shallower inclination towards the central axis Z before crossing it, exhibits the best-performance. It is known from the literature (Hosokawa et al., Optik 58, p.241 (1981)) that nine (9) deflectors D are necessary and sufficient to fully compensate all six (6) aberrations linear in the deflection plus the geometric conditions of correct image magnification, perpendicular beam landing at the target, and central axis Z of FIG. 1 crossing at the 'symmetry point' of the doublet. The assumption is that other aberrations, e.g. those quadratic in the deflection, are compensated by other elements usually referred to as "dynamic correctors", as their excitation varies in synchronism with the deflection. See Petric U.S. Pat. No. 5,635,719 for "Variable Curvilinear Axis Deflection Means for Particle Optical Lenses" which shows a CVA Collimator lens with set of "n" axis compensation yokes and a CVAL lens with another set of "n" axis-shifting coils.

Figure 2A:
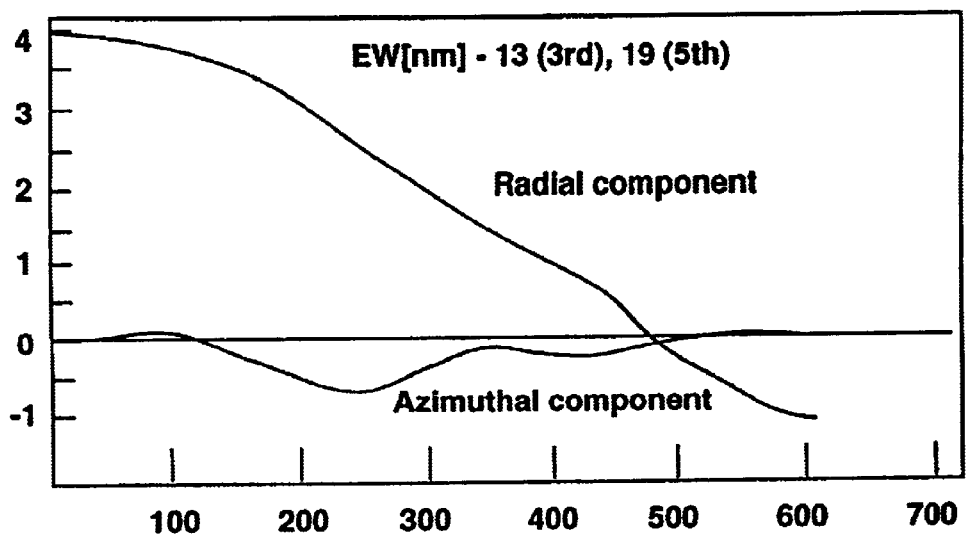
FIGS. 2A–2D show four examples of CVAs.
Figure 2B:
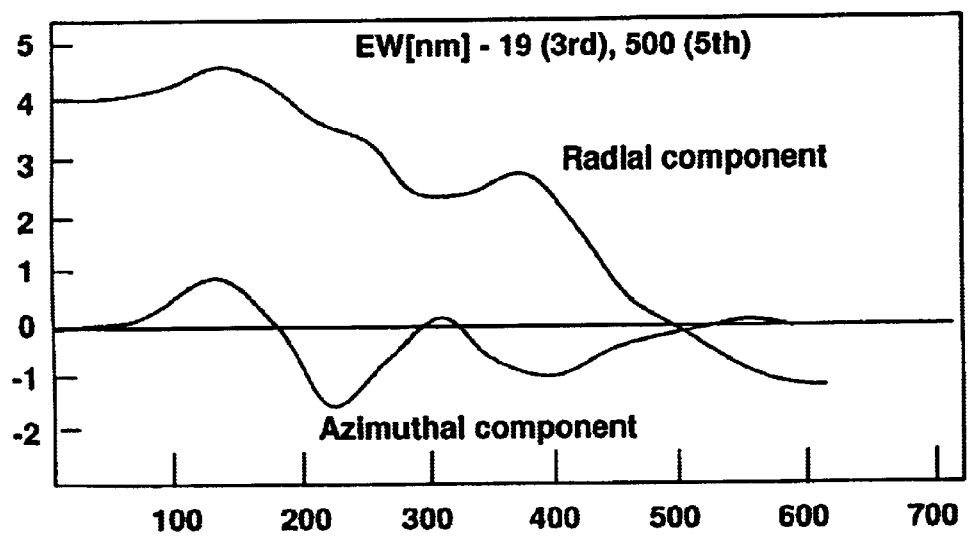
Figure 2C:
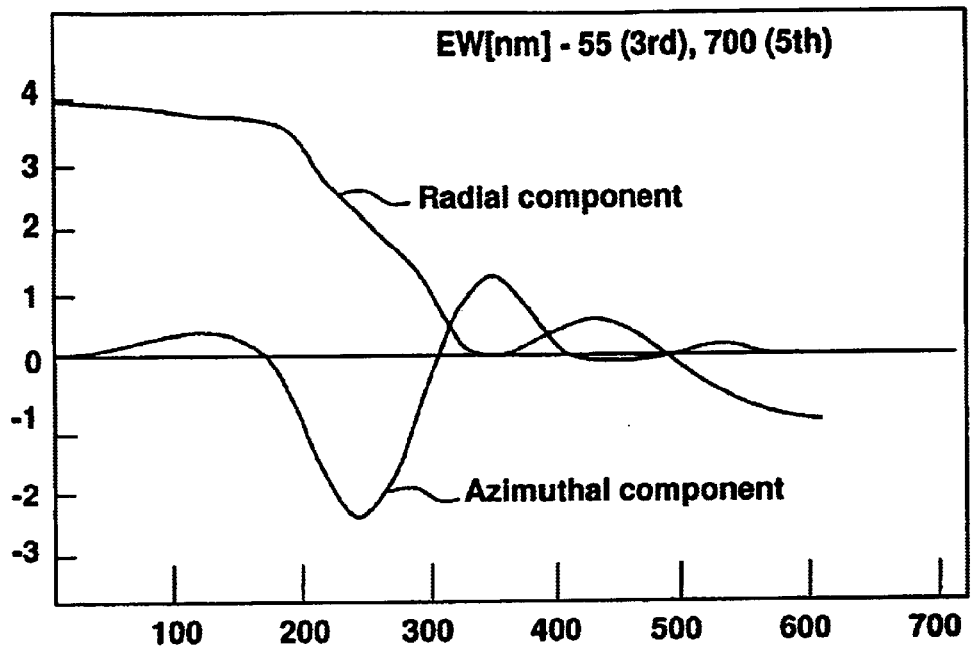
Figure 2D:
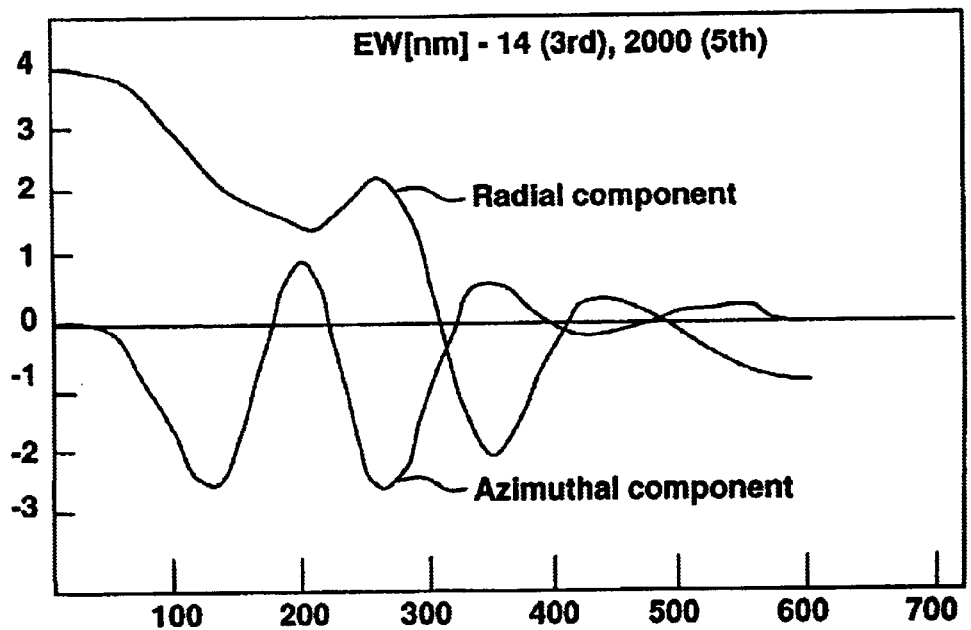
Figures 3A, 3B:
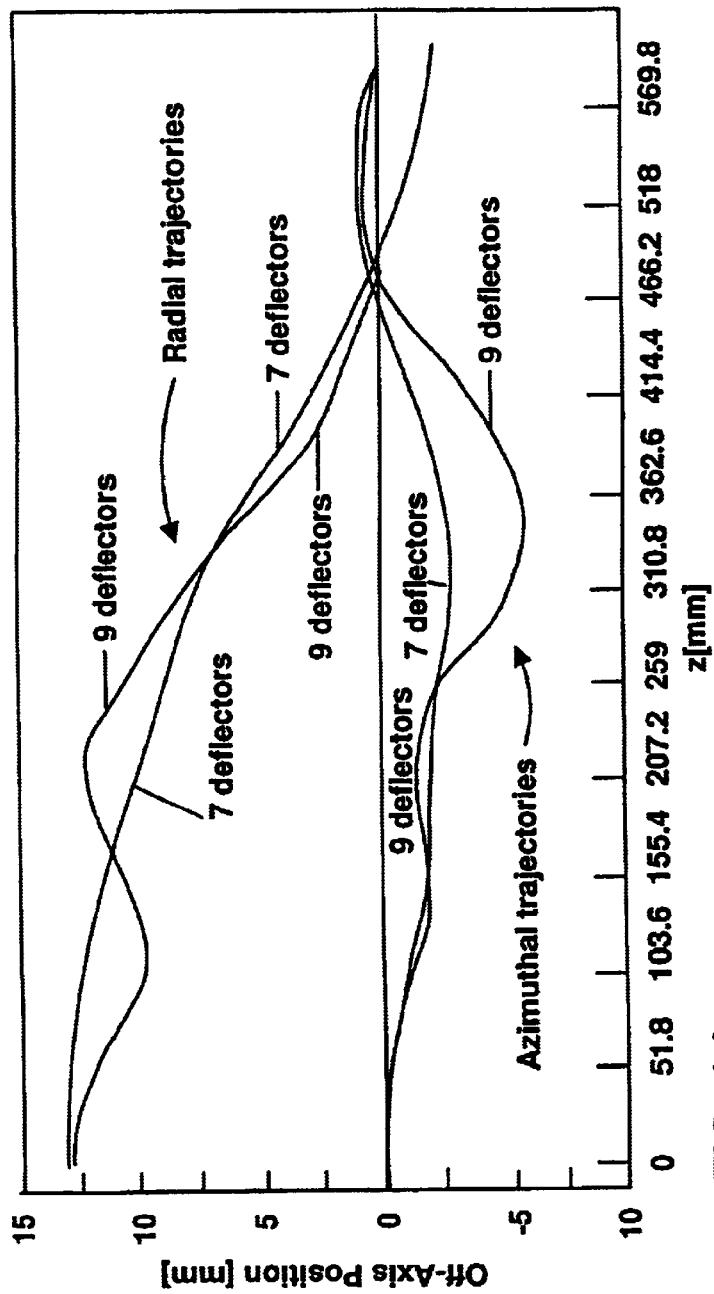
FIGS. 3A–3B show that suitable placement and choice of seven deflectors may result in a smoother CVA and better performance than the use of nine deflectors.

FIGS. 2A–2D, as well as FIG. 3, show the impact on performance characterized by the criteria of edge width EW and SubField Distortion (SFD) (not shown here) of the position along the longitudinal Z-axis, (i.e. axis Z in FIG. 1) and the number of deflectors, respectively. The lenses are represented for simplicity by mathematical expressions for the axial magnetic field distributions B(z)=tanh(z). The length L of the doublet system was arbitrarily chosen and is about 600 mm, the optical magnification was set to be M=¼, and the off-axis position at the object R of the trajectory representing the cp-beam to be x=10 mm. The "cp-beam" is defined herein as the rays emerging from all object points of the laterally shifted subfield.

The performance results are represented by the image blur in terms of edgewidth EW measured in nanometers (nm), that is the broadening of an ideally sharp edge of a fictitious image feature caused by image blur.

In any case, the image is corrected for field curvature and astigmatism with separate correction elements (not shown) (usually referred to as "dynamic correctors" in accordance with the fact that the beam is not simply deflected off axis to a single position, but the beam is dynamically scanned within a given range). The edgewidth results are shown for calculations up to the 3rd and the 5th order of aberration theory.

U.S. patent application Ser. No. 09/131,113, filed Aug. 7, 1998 of Stickel, Gordon, Pfeiffer and Golladay for "Multi-Element Deflection Aberration Correction for Electron Beam Lithography" shows a set of "dynamic correctors."

FIG. 3, however, demonstrates that suitable placement and choice of e.g. seven (7) deflectors can result in a smoother CVA and better performance than the use of nine (9) deflectors (apparently not necessary but sufficient for satisfactory performance), since fewer deflectors can be either larger and/or more advantageously placed than more of them in the given space between object R and image.

FIGS. 2A, 2D, and 3 further demonstrate that best results are achieved, if the actual CVA stays close to the meridional plane.

Figure 4A:
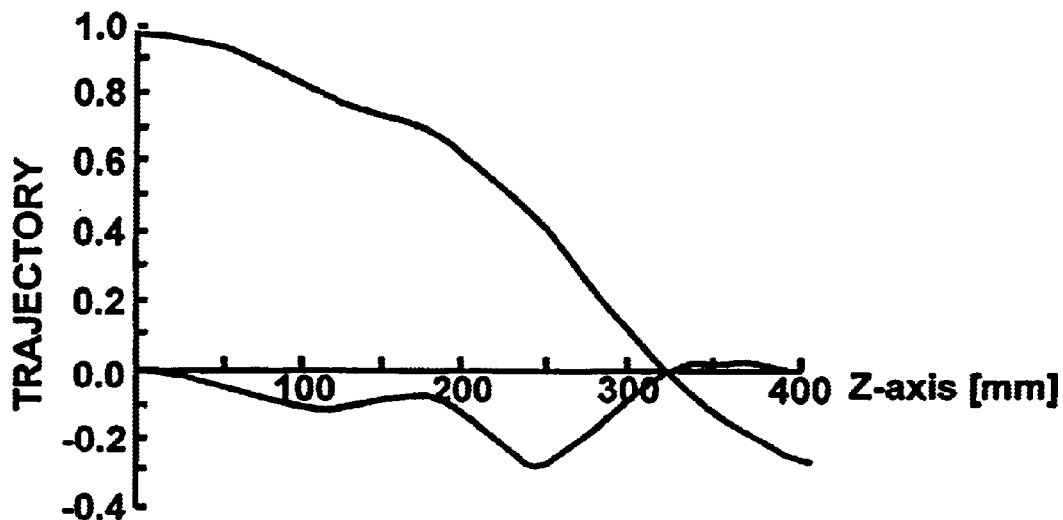
FIGS. 4A–4D show that large excursions from planarity are accompanied by the requirement for large deflector excitations.
Figure 4B:
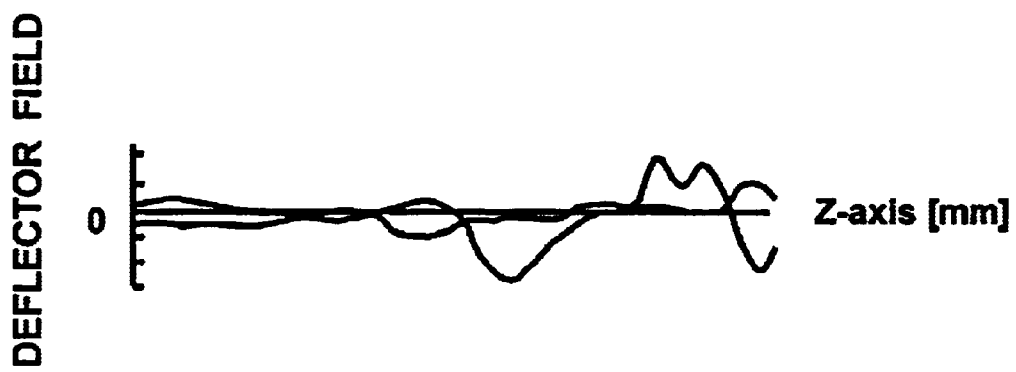
Figure 4C:
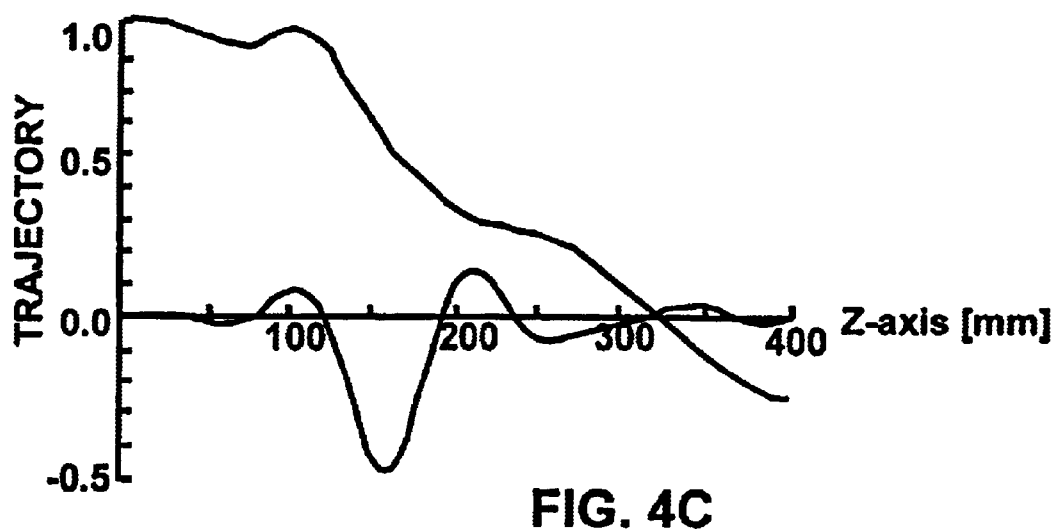
Figure 4D:
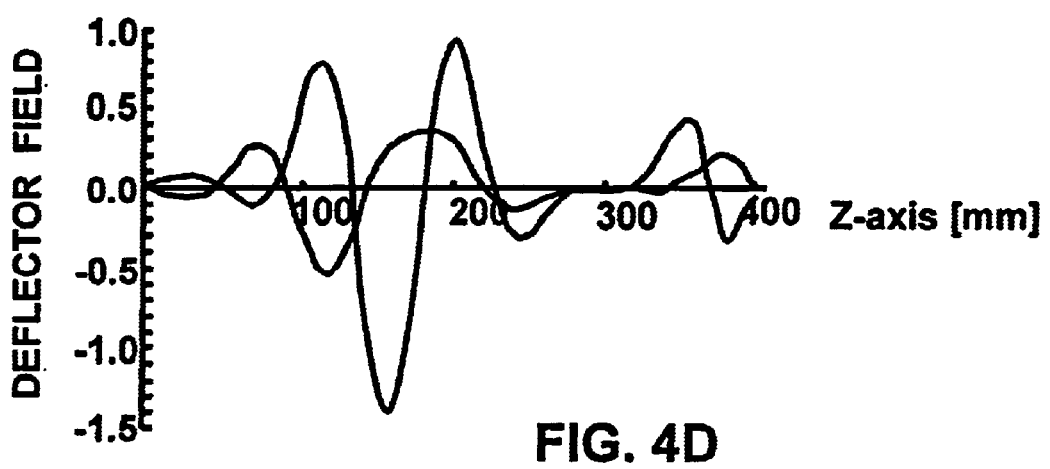

FIGS. 4A–4B, in addition, show that large excursions from planarity are accompanied by a requirement for large deflector excitations, which is obviously undesirable for various reasons, e.g., power consumption can cause excessive heating and consequential mechanical stress which leads to instabilities. Another example is that beam instability can be caused by higher electronic noise.

Although the number of nine (9) deflectors (assisted by five (5) or six (6) dynamic correctors) is theoretically necessary and sufficient to achieve best performance, there are possibilities to optimize by trading off performance with a further reduced number of deflectors providing even more flexibility in their design within the constraints of the system to be as short as possible to reduce interaction blur. Also, modifications of shape and position of the lens fields away from the exact symmetry of the ideal doublet, as used in the present invention, may very well be advantageous.

The results such as those shown in FIGS. 2A–2D, FIG. 3, and FIGS. 4A–4D are obtained from solutions of a set of equations linear in the drive currents of the (magnetic) deflectors placed in the lens system. The number of equations is identical with the number of deflectors D. It should be understood that a deflector D typically consists of two (2) sets of coils on the same "yoke", one set of coils is employed for deflecting the particle beam in the lateral direction x, the other set of coils is employed for deflecting the particle beam in the direction y, where Z is the direction of the system axis as seen in FIG. 1.

Linear Equation Set

A system of linear equations for the case of compensating one aberration with one deflection yoke (lens configuration and strength given), is as follows:

$$A_{11}*I_x + A_{12}*I_y = 0 \qquad (1)$$

$$A_{21}*I_x + A_{22}*I_y = 0 \qquad (2)$$

where e.g.
$A_{11}$=+Re(f)+Im(f)
$A_{12}$=+Re(f)−Im(f)
$A_{21}$=−Re(f)+Im(f)
$A_{22}$=−Re(f)−Im(f)
  Re(f)=Real part of function f
  Im(f)=Imaginary part of function f where f=f (specific aberration chosen to be compensated; and the dimensions and axial position of the yoke);

Ix,Iy=current in the x,y—coil sets wound on the yoke.

The above set of equations is to be generalized for multiple aberrations and yokes as follows:

The values $A_{ik}$ are replaced by $A_{ikjl}$ for the jth aberration to be compensated by the lth yoke and $I_x$ and $I_y$ are replaced by $I_{xl}$ and $I_{yl}$.

$$-Re\{S_o\}=Re\{S_l\}*I_{xl}-Im\{S_l\}*I_{yl}+\ldots+Re\{S_n\}*I_{xn}-Im\{S_n\}*I_{yn} \quad (3)$$

$$-Im\{S_o\}=Im\{S_l\}*I_{xl}-R_e\{S_l\}*I_{yl}+\ldots+Re\{S_n\}*I_{xn}-Im\{S_n\}*I_{yn} \quad (4)$$

where $S_n$ is an integral for n=0, 1, ... n n is a positive integer equal to the number of aberration coefficients being considered.

For "n" aberration coefficients to become zero (be eliminated), two lines of the type defined by equations (3) and (4) have to be formed for each aberration coefficient.

FIGS. 5A–5D show what happens to the lens field distribution and the CVA when the system length is reduced. Both become distorted and the lens field distribution may no longer fit the doublet condition. The vertical axis is the r axis for the CVA, and B(Z) for the field distribution as it varies along the system axis. The "system length" is defined as the distance between the object R and the image W.

Figure 5A:
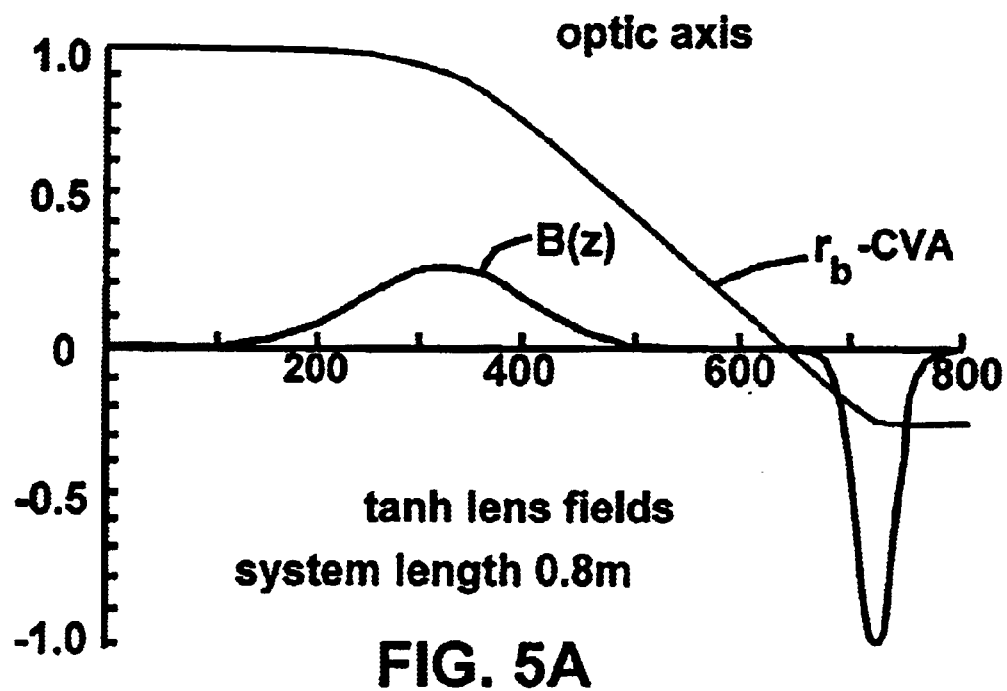
FIGS. 5A–5D show for successively decreasing changes of system length the changes of mathematically defined field distributions of identical doublet lenses. They also show the corresponding radial component $r_b$ of one of the fundamental imaging trajectories.
Figure 5B:
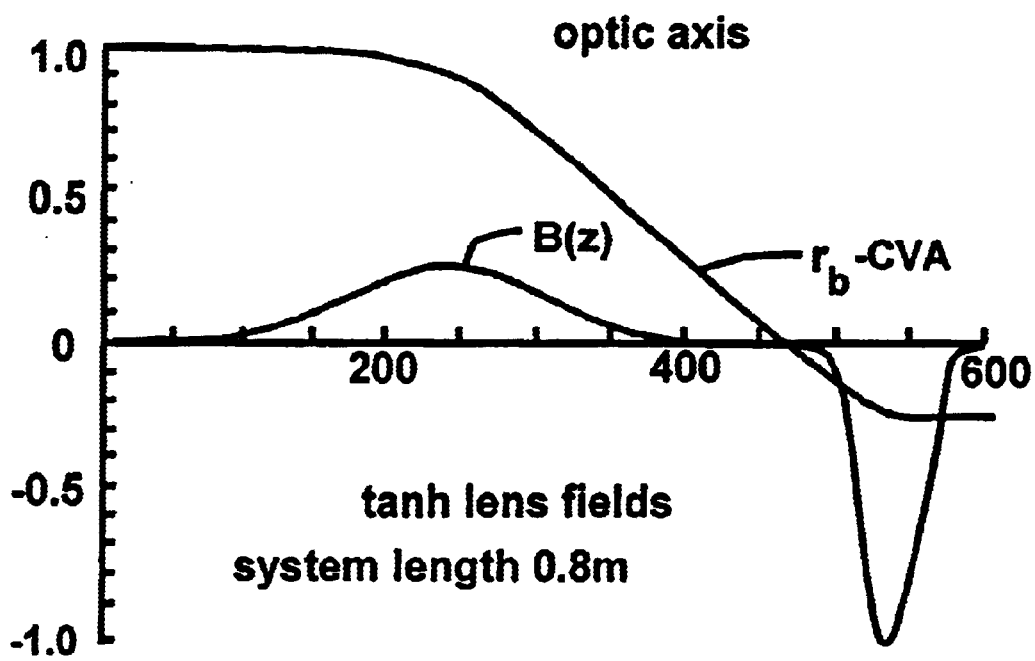
Figure 5C:
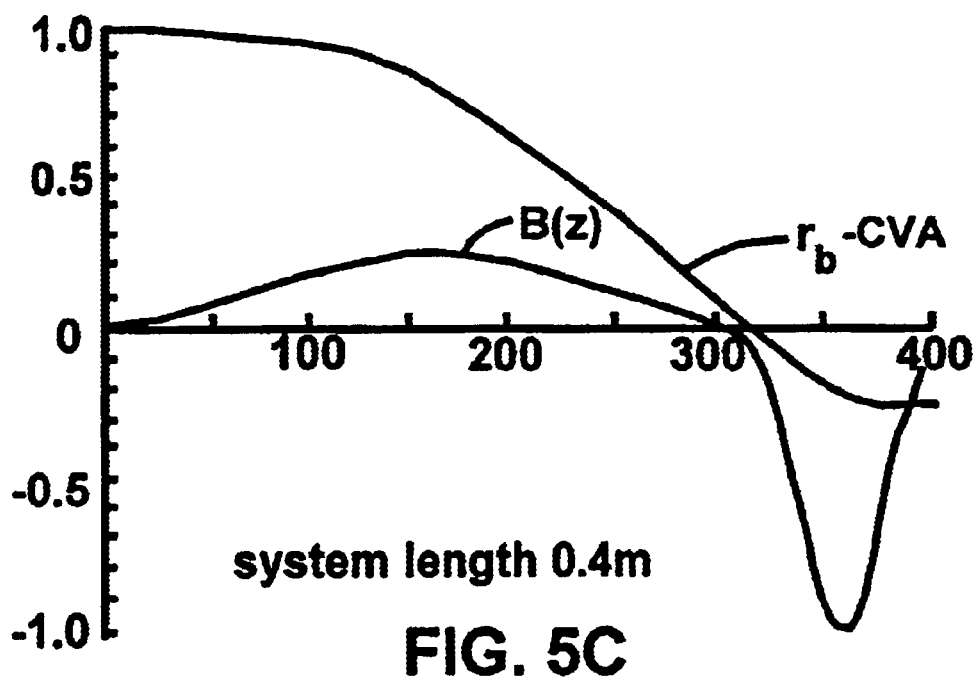
Figure 5D:
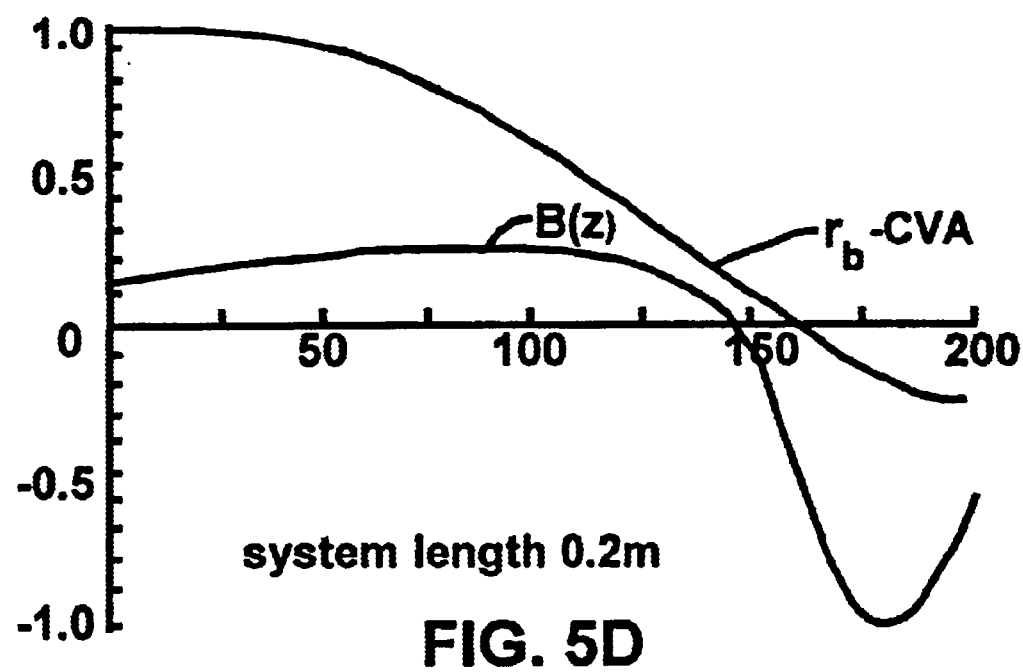

Comparing FIG. 5A with FIGS. 5B, 5C, and FIG. 5D, the originally separate and symmetrically shaped distributions becomes overlapped and distorted and no longer vanishes at the object and image planes, impairing perpendicular landing and causing other problems.

Figure 6:
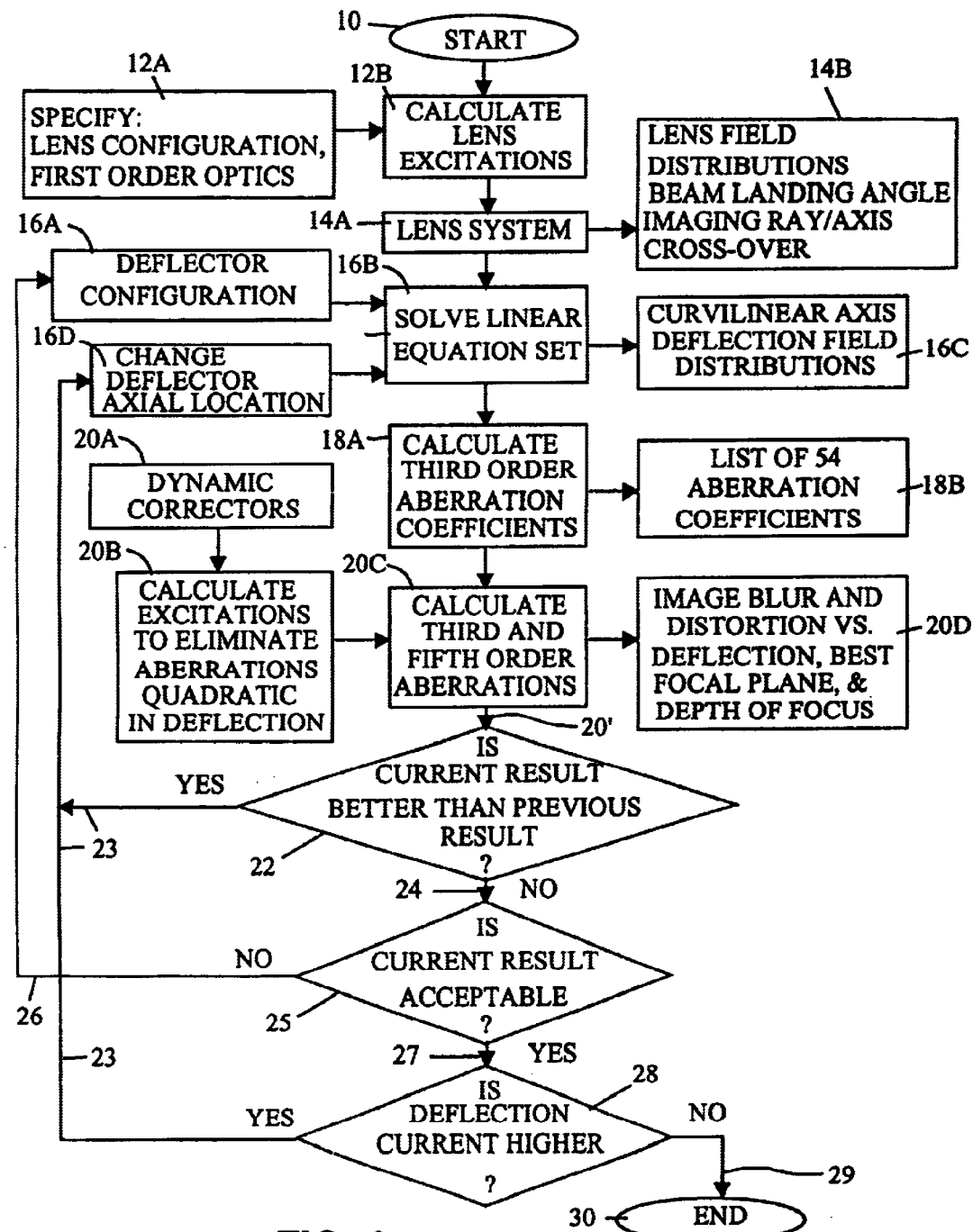
FIG. 6 is a flow chart of an aspect of a method of manufacture of a charged particle beam projection system in accordance with this invention. The flow chart of FIG. 6 outlines the functions to be performed with the computer system shown in FIG. 7

FIG. 6 is a flow chart of the method of interactively designing a charged particle beam projection system in accordance with this invention. The flow chart outlines the functions to be performed by the operator in cooperation with the computer system 60 which is shown in FIG. 7.

Figure 7:
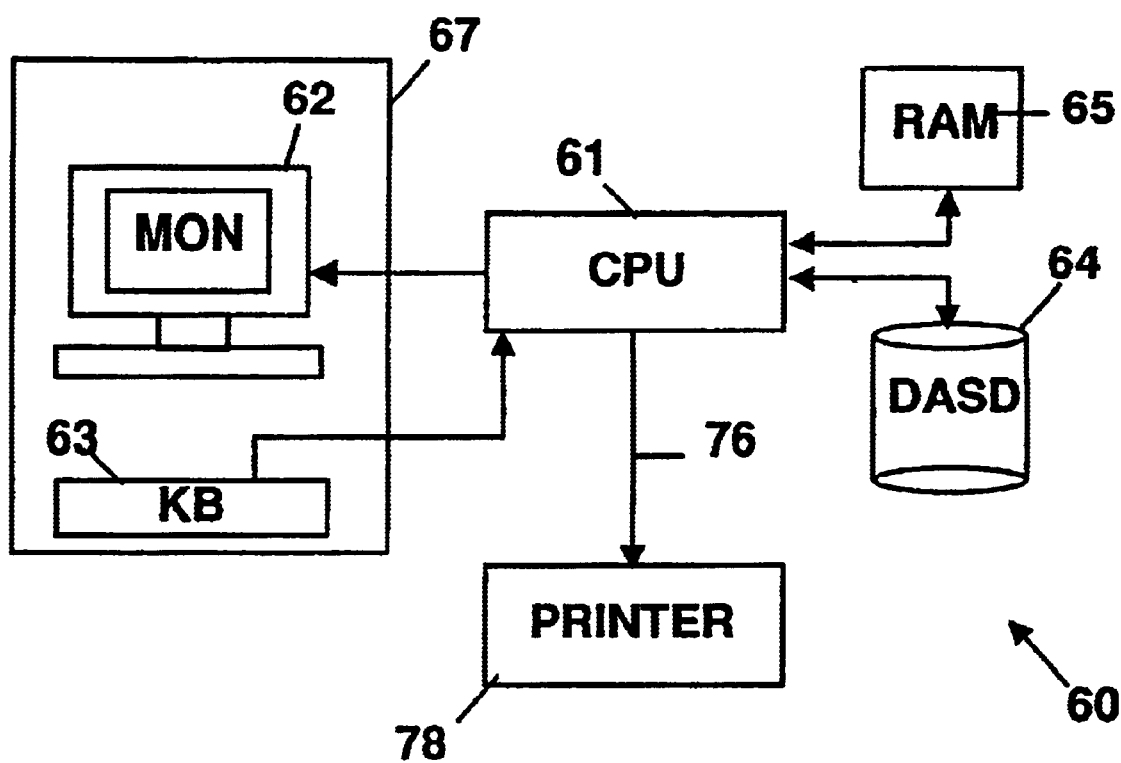
FIG. 7 shows a computer system for use in connection with this invention.

Referring to FIG. 7, the computer system 60 includes a central processing unit (CPU) 61 which supplies visual displays to a monitor 62 which is part of a terminal 67 which also includes a keyboard 63 which supplies input data from an operator to the CPU 61. The CPU 61 is connected to a Random Access Memory (RAM) 65 and a Direct Storage Access Device (DASD) 64.

In step 10 of FIG. 6, the program starts.

In step 12A, the designer specifies to the computer system the factors as follows:

1) Lens configuration:
   The parameters are entered by the designer to define the lens configuration in terms of the number of lenses, positions, pole piece or electrode shape, size, position, ("bore", "gap") and material; number of coil windings or maximum excitation current or voltage.
   In addition, before the lens configuration definition, system specifications are provided including the system length, optical magnification, subfield (object) size, deflection field size, lens field strength, and gradient at the object plane and at the image plane ,etc.

2) First order optics:
   Parameters defining the first order optics are system length, magnification, cross-over aperture position (source position), numerical aperture or crossover size, current distribution in crossover plane, beam incidence at object plane and image plane, and exact 180 degree image rotation from object plane to image plane.

In step 12B the system 60 then calculates lens excitation based upon the lens configuration and first order optics inputs from block 12A.

The formula employed to calculate lens excitations is as follows:

$$\text{Focal length } (f)=K*1/B^2(Z)$$

where

B is proportional to I, and

K is a constant.

After step 12B the system 60 progresses to perform step 14A. In step 14A the lens system 14A determines the values which are produced as outputs 14B of step 14A as follows:

1) lens field distributions
2) beam landing angle
3) imaging ray/axis; cross-over (entrance pupil)

The above values are determined as follows:

i) analytical or Finite Element Analysis (FEA).
ii) electron optics, e.g. "ray tracing"
iii) software.

In step 16A, specifications are supplied to the computer system as to input a new deflector configuration including an axial location of the deflectors D as well as deflectors modified in shape or new deflectors as well as a different number of deflectors with a minimum of three deflectors. Preferably, the number of deflectors would be at least four. The factors involved in the configuration are as follows:

I. Design
   A. Type:
      1. Magnetic
         a. Toroidal
         b. Saddle, or
         c. Combined
      2. Electric
   B. Shape
II. Number, and
III. Axial position The deflector configuration is determined and/or selected by computer (optimization routine) or manually based upon the experience and insight of the operator.

In addition in connection with the input of a deflector configuration the process involves determining the current supply requirements and anticipated power consumption.

In step 16B the system 60 solves the linear equation set of equations (listed above) based upon the deflector configuration input from block 16A. The output of the computer system is data defining the curvilinear axis and the deflection field distributions as indicated in block 16C.

Note that another input to the block in step 16B is a request from decision block 26 below to change the axial location 16D.

The new axial location is determined manually or by an optimization software program which is commercially available.

The next step after block 16B is to calculate third order aberration coefficients as indicated in block 18A.

The formula employed to calculate third order aberration coefficients comprises textbook aberration theory which is found in e.g. P. Grivet, "*Electron Optics*", Pergamon Press, (1972).

The output of block 18A is a set of 54 aberration coefficients as indicated in block 18B.

The next steps after steps 18A and 18B are steps 20A, 20B, 20C and 20D which proceed in that order.

As indicated in block 20B, the dynamic correctors and parameters from block 20A must be entered to define the dynamic correctors, which are dynamic focus coils (adding or subtracting form the lens field strengths); stigmators (quadrupoles), and (possibly) higher order multipoles (e.g. hexapoles). In step 20B, the data from step 20A is used for calculation of excitations to eliminate quadratic aberrations in deflection.

The calculation of excitations to eliminate quadratic aberrations are based on the proportionality:

$$I \sim d^2 (d = \text{deflection in x or y})$$

In step 20C calculate the third order aberrations and the fifth order aberrations. The formulae employed for calculation of the third order aberrations and the fifth order aberrations are given by textbook aberration theory, adapted to the special case of Large Area Projection Optics with Beam Scanning (LARPOS).

The output of block 20D is as follows:
1. Image blur and distortion vs. deflection,
2. best focal plane
3. depth of focus After step 20C following line 20', in step 22, the computer system 60 tests to determine whether the current result is better than the previous result. In the first case, of course, the answer is YES. Then as indicated by line 23, the computer system 60 goes to block 16D to change the axial location of the deflectors D which causes step 16B to solve a new linear equation set based upon a change in the axial location of the deflectors D.

The formulae or algorithm or set of steps employed in step 16D for changing the axial location of the deflectors D are provided by either by an designer who provides a manual input or the use of optimization software based upon the experience and insight of the designer.

If the answer in test 22 is NO, then as line 24 indicates the computer 60 goes on to perform test 25 to determine "Is the current result acceptable?". If the answer is NO, then as indicated by line 26 the computer system 60 branches to step 16B to provide a new deflector configuration including a new axial location of the deflectors D. Thus step 16B to solves a new linear equation set based upon a change in the deflector configuration including a new axial location of the deflectors D. The deflector configuration is determined and/or selected manually based upon the experience and insight of the operator.

If the answer to the test 26 is YES then the program goes on line 27 to a decision block "Is Deflection Current Higher" 28. If YES, then the system branches on line 23 onto line to activate step 16D as described above. If NO the system branches on line 29 to the END 30 of the process.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of optimizing the parameters of a charged particle beam projection system comprising the steps as follows:
   specifying a lens configuration including a collimator lens, a projector lens, and first order optics and then calculating lens excitations;
   configuring a lens system including lens field distributions, a beam landing angle, and an axis crossover of a principal off-axis imaging ray;
   providing an input of a configuration of deflectors formed surrounding and coaxial with the collimator lens and the projector lens including an axial location of the deflectors, then solving a linear equation set, and thereby providing a curvilinear axis and associated deflection field distributions;
   then calculating third order aberration coefficients yielding a list of a plurality of aberration coefficients;
   providing an input of dynamic correctors, then calculating excitations to eliminate quadratic aberrations in deflection, then calculate third and fifth order aberrations, providing image blur and distortion vs. deflection, best focal plane, and depth of focus;
   then testing to determine whether the current result is better than the previous result;
   if the current result is better than the previous result then changing the input for the axial location of the deflectors to solve the linear equation set again, and otherwise testing whether the current result is acceptable;
   if the current result is other than acceptable, then providing a new deflector configuration input to again solve the linear equation set and continuing through the steps thereafter;
   if the current result is acceptable, then testing whether the deflection current is larger; and
   if the deflection current is larger, then changing the input for the axial location of the deflectors to solve the linear equation set again, and if otherwise then END the process.

2. The method of claim 1 wherein the lens system comprises an antisymmetric doublet.

3. The method of claim 1 wherein the lens system comprises a telecentric antisymmetric doublet.

4. The method of claim 1 wherein there are up to 54 aberration coefficients.

5. The method of claim 1 wherein when providing an input of a deflector configuration including the step of providing a beam trajectory with a radial component, the radial component of which decreases from a reticle to an aperture placed at an axis cross-over location and increases from the aperture to a target.

6. The method of claim 5 wherein the lens system comprises an antisymmetric doublet.

7. The method of claim 6 wherein when providing an input of a deflector configuration including the step of providing a beam trajectory with a radial component which decreases monotonically from a reticle to an aperture placed at an axis cross-over location and increases from the aperture to a target.

8. The method of claim 7, wherein the lens system comprises an antisymmetric doublet.

9. The method of claim 7, wherein the lens system comprises a telecentric antisymmetric doublet.

10. The method of claim 5 wherein the lens system comprises a telecentric antisymmetric doublet.

11. The method of claim 5 wherein there are up to 54 aberration coefficients.

12. The method of claim 5 wherein there are up to 54 aberration coefficients.

13. A method of making an optimized charged particle beam projection system with a lens system comprising a telecentric antisymmetric doublet comprising the steps as follows:

specifying lens configuration including a collimator lens, a projector lens, and first order optics and then calculating lens excitations;

configure the lens system thereby providing lens field distributions, and beam landing angle axis cross-over of an imaging ray;

providing an input of a configuration of deflectors formed surrounding and coaxial with the collimator lens and the projector lens including an axial location of the deflectors, then solving a linear equation set, and thereby provide a curvilinear axis and associated deflection field distributions;

then calculating third order aberration coefficients yielding a list of up to 54 aberration coefficients;

providing an input of dynamic correctors, then calculating excitations to eliminate quadratic aberrations in deflection, then calculating third and fifth order aberrations, providing image blur and distortion vs. deflection, best focal plane, and depth of focus;

then testing to determine whether a current result is better than a previous result, if the current result is better than the previous result then changing the input for the axial location of the deflectors to solve the linear equation set again, and otherwise testing whether the current result is acceptable;

if the current result is other than acceptable, then providing a new deflector configuration input to again solve the linear equation set and continuing through the steps thereafter;

if the current result is acceptable, then testing whether the deflection current is larger; and if the deflection current is larger, then changing the input for the axial location of the deflectors to solve the linear equation set again, and if otherwise then END the process.

* * * * *